US 6,746,819 B1

(12) United States Patent
Schmitz et al.

(10) Patent No.: US 6,746,819 B1
(45) Date of Patent: Jun. 8, 2004

(54) USE OF POLYIMIDE FOR ADHESIVE LAYERS, LITHOGRAPHIC METHOD FOR PRODUCING MICROCOMPONENTS AND METHOD FOR PRODUCING COMPOSITE MATERIAL

(75) Inventors: Felix Schmitz, Mainz (DE); Matthias Nienhaus, Mainz (DE)

(73) Assignee: Institut fur Mikrotechnik Mainz GmbH, Mainz (DE)

(*) Notice: Subject to any disclaimer, the term of this patent is extended or adjusted under 35 U.S.C. 154(b) by 0 days.

(21) Appl. No.: 10/130,223

(22) PCT Filed: Nov. 17, 2000

(86) PCT No.: PCT/EP00/11448

§ 371 (c)(1),
(2), (4) Date: Aug. 5, 2002

(87) PCT Pub. No.: WO01/37050

PCT Pub. Date: May 25, 2001

(30) Foreign Application Priority Data

Nov. 19, 1999 (DE) .......................... 199 55 969

(51) Int. Cl.$^7$ ........................... G03F 7/11; G03F 7/038; H01L 21/768
(52) U.S. Cl. ............................ 430/272.1; 430/275.1; 430/276.1; 430/278.1; 430/279.1; 430/8; 430/312; 430/314
(58) Field of Search .......................... 430/272.1, 275.1, 430/276.1, 278.1, 279.1, 8, 312, 314

(56) References Cited

U.S. PATENT DOCUMENTS

| 4,282,295 A | * | 8/1981 | Lee et al. ....................... 430/2 |
| 4,481,279 A | * | 11/1984 | Naito et al. ............... 430/280.1 |
| 4,874,461 A | * | 10/1989 | Sato et al. ..................... 216/23 |
| 5,843,259 A | * | 12/1998 | Narang et al. .............. 156/151 |
| 5,849,809 A | * | 12/1998 | Narang et al. ................ 522/35 |
| 6,130,148 A | * | 10/2000 | Farnworth et al. .......... 438/613 |
| 6,162,580 A | * | 12/2000 | Matsuoka et al. ........ 430/283.1 |

FOREIGN PATENT DOCUMENTS

| EP | 0 067 066 | 12/1982 |
| EP | 0 394 638 | 10/1990 |
| EP | 0 623 852 | 11/1994 |
| EP | 0 718 696 | 6/1996 |

OTHER PUBLICATIONS

McKeon et al, "Base–Catalyzed Photosensitive Polyimide" in Advances in Resist Technology and Processing C, William D. Hinsberg, Editor, Proc, SPIE 1925, pp. 507–515 (1993). ISBN 0–8194–0827–1.*
SU–8 Resistmaterial (Shell Chemical commercial name), which is a cross–linkable polymer that is described in J. Micromechanics, Microengineering 7(1997), pp. 121–124.
Proc. SPIE vol. 3680B–65 Paris, France, Mar. 30 through Apr. 1, 1999 "Micromachining and Microfabrication", title "Design and realization of a penny–shaped micromotor" by M. Nienhaus et al.
TRIP. vol. 3, No. 8, Aug. 1995, pp. 262–271, entitled "The Synthesis of Soluble Polyimides" by Samual J. Huang and Andrea E. Hoyt.
SPIE vol. 1925, pp. 507–515 entitled "Base–Catalyzed Photosensitive Polyimide" by Dennis R. McKean et al., No Year Given by Applicant.

* cited by examiner

*Primary Examiner*—Cynthia Hamilton
(74) *Attorney, Agent, or Firm*—Hudak, Shunk & Farine, Co. LPA

(57) ABSTRACT

The invention relates to a lithographic method for producing microcomponents with component structures in the submillimeter range. According to the inventive method, a structured adhesive layer is applied to a metal layer and then a photostructured epoxy resin layer is applied to said adhesive layer. Said epoxide resin is structured by means of selective exposition and removing the unexposed zones and filling in the gaps between the resin structures with metal by electroplating. The aim of the invention is to provide an adhesive layer that is suitable for photostructured epoxy resins, especially for SU-8 resist material and that prevents the resist material from being detached. To this end, the adhesive layer consists of polyimide or a polyimide mixture.

14 Claims, 3 Drawing Sheets

USE OF POLYIMIDE FOR ADHESIVE LAYERS, LITHOGRAPHIC METHOD FOR PRODUCING MICROCOMPONENTS AND METHOD FOR PRODUCING COMPOSITE MATERIAL

FIELD OF THE INVENTION

The invention relates to the use of polyimide and a lithographic method for producing microcomponents with component structures in the sub-millimeter range, in which a structurable adhesive layer is applied to a metal layer, and a layer of photostructurable epoxy resin is applied to the adhesive layer. The epoxy resin is structured by selective exposure and removal of the unexposed areas. After removal of the adhesive layer from the gaps between the resin structures, the gaps are filled with metal by electrodeposition. The invention further relates to a method for producing a composite material comprising a substrate, metal, and photostructurable epoxy resins.

BACKGROUND OF THE INVENTION

In lithographic processes various polymers are used as resist materials. Resist materials are defined as materials that can be structured by means of exposure to light.

PMMA is the most widely used resist material but has the drawback that synchrotron radiation must be used for exposure to produce microstructures with an aspect ratio >10. This is both time-consuming and costly.

Attempts have therefore been made to switch to photostructurable resist materials that can be structured, for instance, by means of UV light. These materials have the drawback, however, that they cannot be used to obtain large aspect ratios.

A resist material that permits large aspect ratios of, for instance, 15 and above and that can be structured by means of UV light is epoxy resin, particularly an epoxy derivative of a bis-phenol-A Novolac, which is already used in semiconductor technology. This resist material is used in the form of SU-8 resist (trade name of Shell Chemical) and is described, for instance, in J. Micromechanics, Microengineering 7 (1997) pp. 121–124. Large aspect ratios can be obtained because cross-linking as a result of exposure to light causes the refraction index of this material to change, so that structures with waveguide properties can be produced from the resist material. With the aid of masks, vertical walls are obtained by means of light exposure, which are preserved when unexposed areas are etched away.

SU-8-material has the drawback, however, that it does not adhere to all metals or silicon, which are usually used as the starting layers for electrodeposition processes or as substrates.

While SU-8 adheres well to aluminum, its adhesion to gold or nickel depends on the size of the microstructure, i.e. on the lateral dimensions of the microcomponent.

Adhesion to copper, silver, chromium and nickel is less good, so that an adhesive layer is required between the metal and the SU-8 resist.

Proc. SPIE Vol. 3680B-65 Paris, France, March 30 to Apr. 1, 1999, "Micromachining and Microfabrication," entitled "Design and realization of a penny-shaped micromotor" by M. Nienhaus et al. describes the use of a bonding agent, e.g. hexamethyldisilazane (HMDS) between the copper starting layer and the SU-8 material. This has the drawback, however, that the bonding agent is particularly thin, so that adhesion is not satisfactory in all cases.

SUMMARY OF THE INVENTION

One object of the invention is thus to provide an adhesive layer that is suitable for photostructurable epoxy resins, particularly for SU-8 resist, and that prevents detachment of the resist. Another object of the invention is to provide a method for producing a composite material and a lithographic method for producing microcomponents, in which adhesion problems related to the resist do not occur.

Surprisingly it has been found that polyimide or polyimide mixtures are excellently suited as the adhesive layer between photostructurable epoxy resin and metals or silicon.

Good adhesion can be obtained on microcomponents with lateral dimensions in the mm and cm range.

Polyimides or photostructurable polyimides that may be considered are described in TRIP. Vol. 3, No. 8, August 1995, pp. 262–271, entitled "The Synthesis of Soluble Polyimides" by Samual J. Huang and Andrea E. Hoyt as well as in SPIE Vol. 1925, pp. 507–515 entitled "Base-Catalyzed Photosensitive Polyimide" by Dennis R. McKean et al. Mixtures of these polyimides are also suitable as adhesive layers.

The method for producing a composite material comprising a substrate, metal and photostructurable epoxy resins is characterized in that a metal layer with microtopography is deposited on the substrate and a polyimide layer is applied to the metal layer as an adhesive layer, to which the epoxy resin is subsequently applied.

Microtopography is defined as roughnesses in the nanometer range. The improvement in the adhesion is achieved by compensating tensions of the polyimide layer in the rough surface.

The polyimide layer is preferably applied with a thickness of <1 $\mu$m, preferably with a thickness of 500 to 900 nm. It has been shown that at these small thicknesses the tensions to which the polyimide layer is subject are negligible.

The substrate can be made, for instance, of silicon, glass, plastic, or ceramic, while the metal layer or layers can be a titanium, copper, nickel, and/or silver layer. For instance, if two materials are applied, a titanium layer is applied first and then the copper layer. The layer thicknesses of these metal layers are preferably between 100 and 500 nm. The metal layers can be deposited by means of sputtering processes or vapor deposition.

The metal layer, prior to depositing the polyimide material, is preferably dehydrogenated at 200° C. to 300° C. for a period of 10 to 60 min. Preferred values are 240° C. to 260° C. and 25 to 35 min.

The polyimide layer is preferably applied to the dehydrogenated metal layer by means of a spin coat process. After dehydrogenation, no further process steps are required prior to applying the polyimide layer.

Preferably, a precursor material is applied to the metal layer, which is subsequently subjected to a heat treatment to form the polyimide. The precursor materials used are monomer materials of preferably polyamide carboxylic acids. A subsequent heat treatment is used to affect cyclization or ring synthesis, so that polyimide is produced.

The heat treatment is preferably carried out for 0.5 to 2 minutes at 80° C. to 100° C. and 2 to 4 minutes at 100° C. to 120° C.

Preferably, UV light is used for floodlight exposure to start the cross-linking process. An additional heat treatment, preferably at 100° C. to 110° C., serves for further cross-linking. The unexposed or non-crosslinked areas are removed by subsequent development, e.g. with butyl acetate.

The lithographic process for producing microcomponents provides for the use of an adhesive layer of polyimide or a mixture of polyimides, possibly with the addition of bonding agents or photoinitiators. Since the metal layer, to which the epoxy resin is applied over the adhesive layer, is also the starting layer for the subsequent electrodeposition process, those areas where metal is to be deposited must be uncovered. There are two preferred embodiments to accomplish this.

According to the first preferred embodiment, after structuring the epoxy resin, the uncovered zones of the adhesive layer are removed by plasma etching to expose the metal starting layer.

According to the second embodiment, the polyimide used is a photostructurable polyimide.

Other preferred process steps provide for the selective exposure of the adhesive layer of photostructurable polyimide prior to applying the epoxy resin and the removal of the unexposed areas. Subsequently, the epoxy resin is applied all over the adhesive layer, and essentially those areas of the epoxy resin under which the adhesive layer is located are exposed. Thereafter, the unexposed areas of the epoxy resin are removed to uncover the metal layer.

This presumes that both the adhesive layer and the resist layer of epoxy resin are exposed in the same locations.

To this end, preferably the same mask is used for the two exposure processes.

It is also possible to use so-called laser direct-writers whose laser beam is guided over the object to be exposed. When such laser direct-writers are used, the adhesive layer and the epoxy resin layer are each exposed with the same line guidance of the laser beam.

BRIEF DESCRIPTION OF THE DRAWINGS

Exemplary embodiments of the invention will now be described in greater detail with reference to the drawings in which FIGS. 1a–1e schematically show the production of a microcomponent by means of a lithographic process using polyimide adhesive layers in accordance with a first embodiment

DETAILED DESCRIPTION OF THE INVENTION

FIGS. 1a to 1e illustrate the production process of a microcomponent with metal component structures in accordance with a first embodiment. First, a titanium adhesive layer 2 with a thickness of 100 nm is deposited on a silicon substrate 1. A copper starting layer 3 with a thickness of 1 μm is then applied to this titanium adhesive layer 2.

Figure 1A:
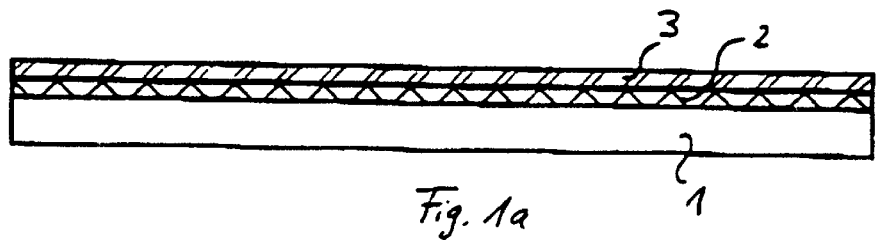
Figure 1B:
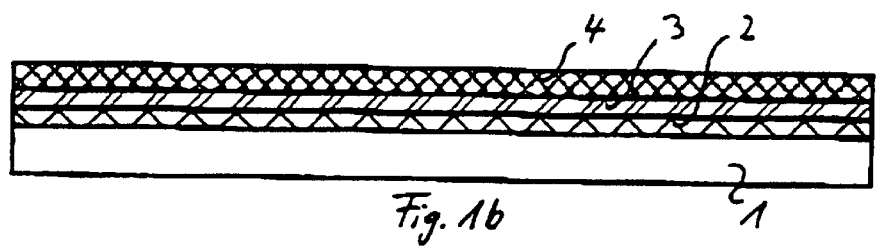

In a further process step illustrated in FIG. 1b, the adhesive layer 4 of polyimide or a polyimide mixture is applied over the enter area.

Figure 1C:
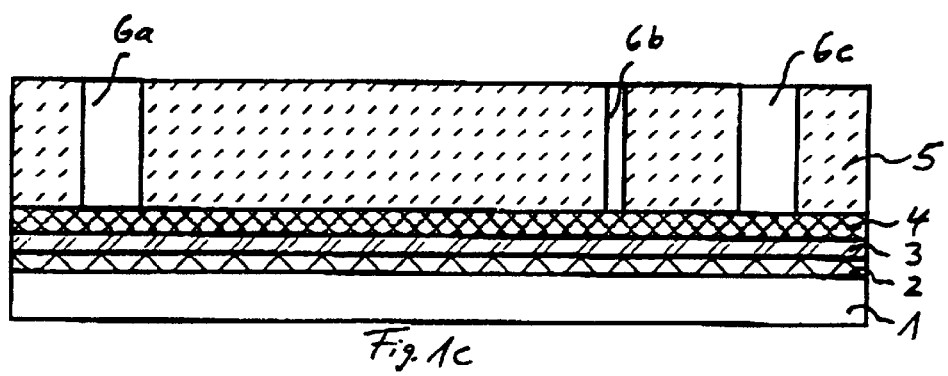

In FIG. 1c a resist layer 5 of SU-8 resist had been applied and exposed by UV light, and the unexposed areas were removed. Thus, FIG. 1c already shows uncovered structures 6a, b and c. Due to the previous full-area application, the polyimide adhesive layer 4 is still found at the base of these structures 6a, b, c, so that the underlying copper starting layer 3 is not accessible.

Figure 1D:
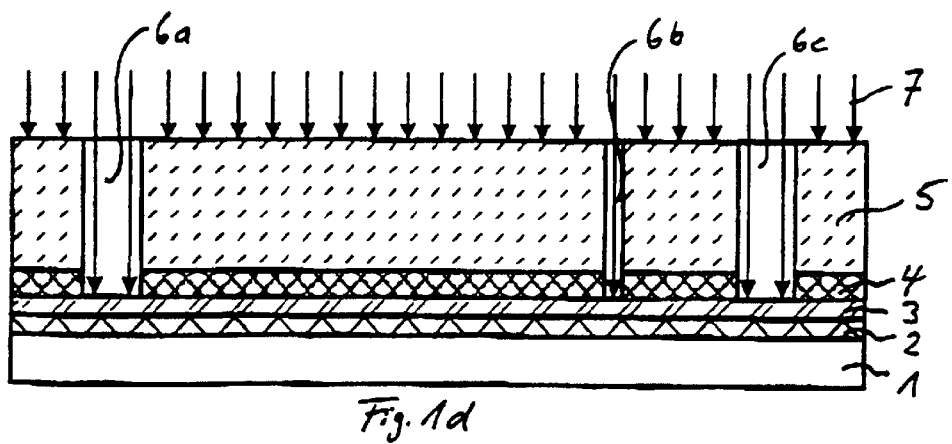
Figure 1E:
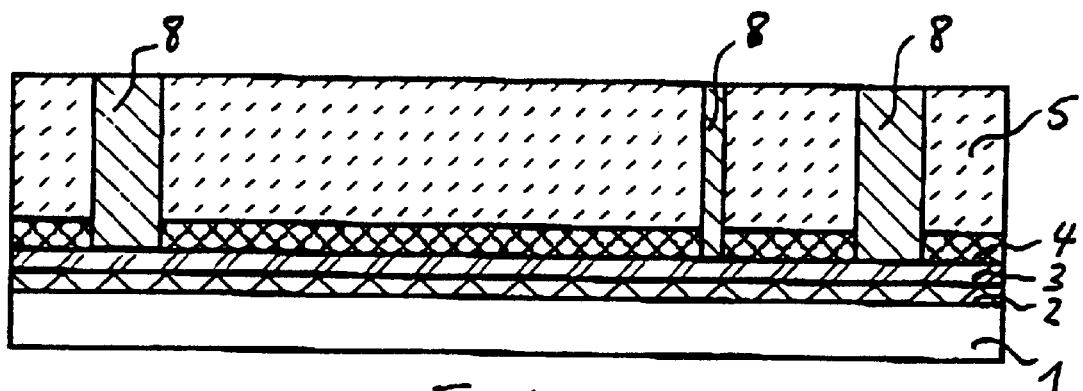

To uncover the copper starting layer 3 in a further process step illustrated in FIG. 1d, layer 3 [sic] is removed by a plasma treatment (plasma 7) specifically in the area of structures 6a, b and c. The copper starting layer is then available, so that the structures 6a, b, c can be filled with metal by electrodeposition to form a microcomponent with metal component structures.

The process sequence to produce the adhesive layer is as follows:

| | |
|---|---|
| Substrate 1: | 5" Si wafer with vapor deposited 100 nm Ti adhesive layer followed by a 500 nm Cu starting layer |
| Dehydrogenation: | in a vacuum furnace at 250° C. for 30 min. |
| Spin coating: | At 6250 rpm with 2 ml "Probimide 7000" (trademark of Arch Chemical, USA) dissolved with 24% by weight NMP (n-methyl-pyrrolidone) |
| Drying: | 1 minute at 90° C. and 3 minutes at 110° C. on a heated plate to improve cross-linking |
| Exposure: | floodlight exposure without mask with 100 mJ/cm$^3$ |
| Possibly heat treatment (post exposure bake): | at 100° C. to 110° C. |
| Developing: | with butyl acetate |
| Imidization: | under N$_2$ at 380° C. for 60 minutes |
| Resulting layer thickness: | approximately 800 nm |

Figure 2A:
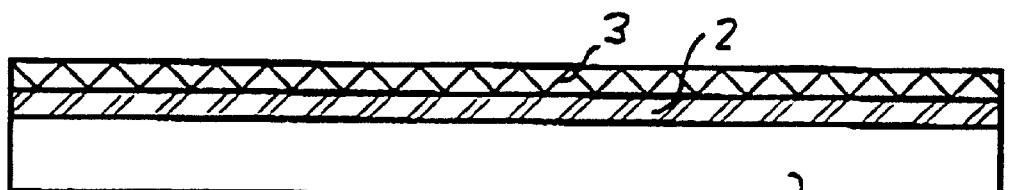
FIGS. 2a–2f show a lithographic process according to a second embodiment.
Figure 2B:
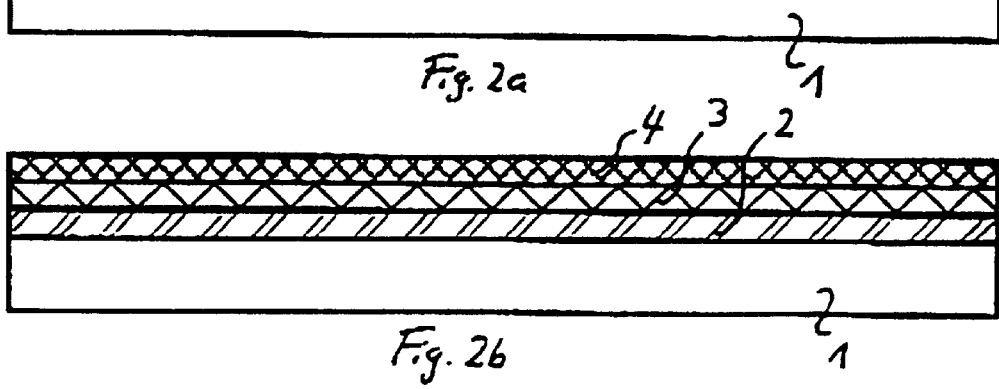

FIGS. 2a to 2f schematically show another embodiment for producing metal microcomponents. FIGS. 2a and 2b show the same process steps as FIGS. 1a and 1b except that an Au starting layer 3 instead of a Cu starting layer is applied.

Figure 2C:
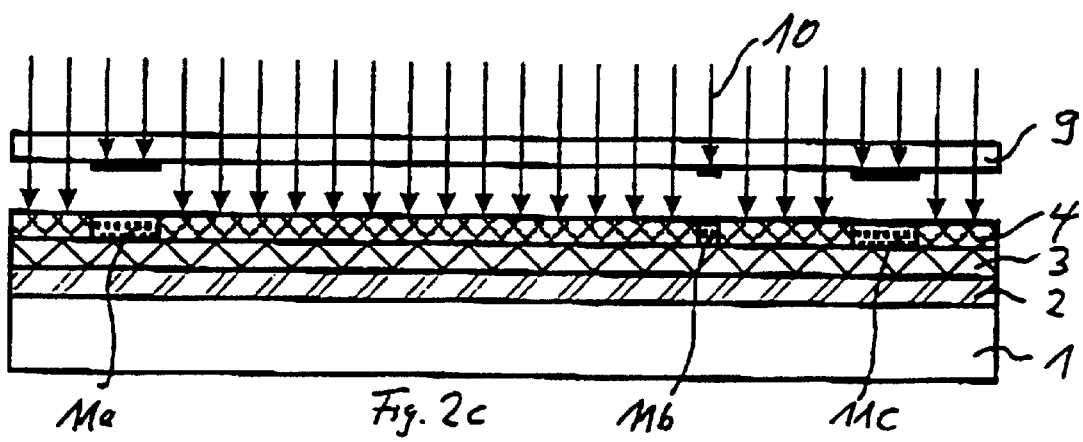
Figure 2D:
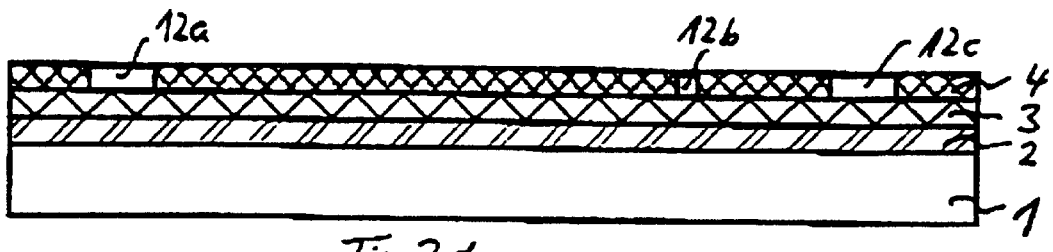

According to FIG. 2c, the polyimide layer 4 is exposed by UV light 10 (220 mJ/cm$^3$) and a mask 9. This creates unexposed areas 11a, 11b, 11c in the polyimide layer, which are removed in a subsequent step illustrated in FIG. 2d. Through the polyimide structures 12a, b, c thus created, the areas of the starting layer 3 where electrodeposition is to take place are uncovered.

Figure 2E:
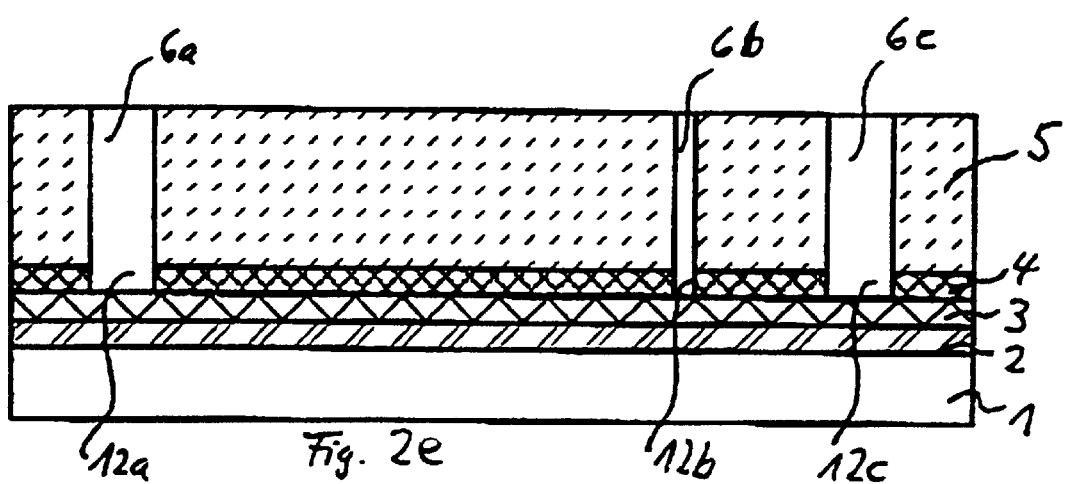
Figure 2F:
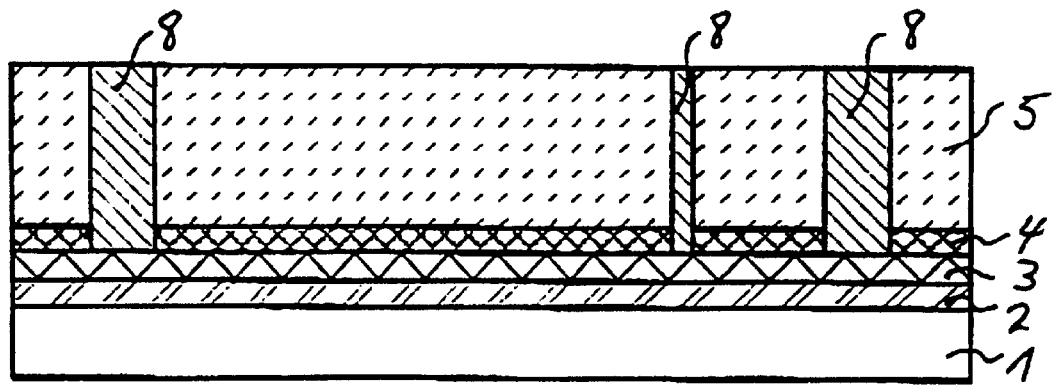

In the following step, illustrated in FIG. 2e, a layer 5 of SU-8 material is applied and the same mask 9 is used for UV light exposure. The unexposed areas of layer 5 are also removed; such that structures 6a, b, c are uncovered. Since the same mask 9 was used, structures 12a, b, c and 6a, b, c are superimposed. The electrodeposition process to fill these structures with metal can thus follow immediately, as shown in FIG. 2f.

REFERENCE NUMERALS 1 substrate
2 titanium adhesive layer
3 copper starting layer
4 polyimide layer
5 resist layer
6a, b, c uncovered structure
7 plasma
8 metal
9 mask
10 UV light
11a, b, c unexposed areas of the polyimide layer
12a, b, c uncovered polyimide structure

What is claimed is:

1. An article, comprising: a polyimide or polyimide mixtures for an adhesive layer with a thickness of <1 μm between photostructurable epoxy resins and metal or silicon, wherein the polyimide is photostructurable.

2. A lithographic method for producing microcomponents with component structures in the sub-millimeter range comprising the steps of: applying a structurable adhesive layer to a metal layer and a layer of photostructurable epoxy resin to the adhesive layer, structuring the epoxy resin by means of selective exposure and removing the unexposed areas, and after the removal of the adhesive layer from the gaps between the resin structures, filing the gaps with metal through an electrodeposition process, wherein an adhesive layer of polyimide or a polyimide mixture with a thickness of <1 µm is used.

3. A method as claimed in claim 2, wherein after structuring of the epoxy resin, the uncovered adhesive layer is removed by plasma etching to uncover the metal layer.

4. A method as claimed in claim 2, wherein the polyimide used is a photostructurable polyimide.

5. A lithographic method for producing microcomponents with component structures in the sub-millimeter range comprising the steps of: applying a structurable adhesive layer to a metal layer and a layer of photostructurable epoxy resin to the adhesive layer, structuring the epoxy resin by means of selective exposure and removing the unexposed areas, and filing the gaps between the resin structures with metal through an electrodeposition process, wherein an adhesive layer of photostructurable polyimide or a photostructurable polyimide mixture with a thickness of <1 µm is used, and prior to application of the epoxy resin, the adhesive layer is selectively exposed and the unexposed areas are removed, the epoxy resin is then applied all over the adhesive layer and the uncovered metal layer, essentially those areas of the epoxy resin under which the adhesive layer is located are exposed, and the unexposed areas of the epoxy resin are subsequently removed to uncover the metal layer.

6. A method as claimed in claim 5, wherein the adhesive layer and the epoxy resin layer are exposed using the same mask.

7. A method as claimed in claim 5, wherein the adhesive layer and the epoxy resin layer are exposed using a laser direct-write process.

8. A method for producing a composite material of a substrate, metal, and photostructurable epoxy resins, comprising the steps of:

applying a metal layer with microtopography to the substrate, and applying a polyimide layer with a thickness of <1 µm to the metal layer as an adhesive layer to which the epoxy resin is subsequently applied.

9. A method as claimed in claim 8, wherein a substrate of silicon, glass, plastic, or ceramic is used.

10. A method as claimed in claim 8, wherein a metal layer or layers of titanium, copper, nickel, or silver are used.

11. A method as claimed in claim 8, wherein prior to application of the polyimide layer, the metal layer is dehydrogenated at 200° C. to 300° C. for a period of 10 to 60 minutes.

12. A method as claimed in claim 8, wherein the polyimide layer is applied to the dehydrogenated metal layer using a spin coat process.

13. A method as claimed in claim 8, wherein a precursor material is applied to the metal layer and is subsequently subjected to a heat treatment to form the polyimide.

14. A method as claimed in claim 13, wherein the heat treatment is carried out for 0.5 to 2 minutes at 80° C. to 100° C. and 2 to 4 minutes at 100° C. to 120° C.

* * * * *